United States Patent
Ochiai et al.

(10) Patent No.: US 6,374,392 B1
(45) Date of Patent: Apr. 16, 2002

(54) SEMICONDUCTOR TEST SYSTEM

(75) Inventors: Katsumi Ochiai, Gyoda; Noriyuki Masuda, Ageo, both of (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/312,355

(22) Filed: May 14, 1999

(30) Foreign Application Priority Data

May 20, 1998 (JP) .......................................... 10-138473

(51) Int. Cl.[7] .............................. G06F 9/45; G01R 31/28
(52) U.S. Cl. ................................ 716/6; 716/4; 714/744
(58) Field of Search ...................... 716/6, 7, 4; 714/744

(56) References Cited

U.S. PATENT DOCUMENTS 5,894,226 A * 4/1999 Koyama et al. ............ 324/765
6,032,282 A * 2/2000 Matsuda et al. ............ 714/744
6,253,360 B1 * 6/2001 Yoshiba ........................ 716/6

* cited by examiner

Primary Examiner—Huan Hoang
(74) Attorney, Agent, or Firm—Muramatsu & Associates

(57) ABSTRACT

A semiconductor test system is capable of generating timing edges in the same direction having a time interval smaller than a reference clock cycle. The semiconductor test system includes a waveform memory for storing edge data which defines edges of a test signal waveform, a timing generator for generating timing data and a timing pulse for each test cycle, a wave formatter for generating a set signal and a reset signal for producing the test signal waveform in response to the timing data and the timing pulse, and a virtual timing generator for detecting a relationship between previous edge data and current edge data from the waveform memory and removing the current edge data when the current edge data is the same as the previous edge data and allocating the current edge data to a time position where there is an actual change of edge in the test signal waveform.

9 Claims, 8 Drawing Sheets

FIG.3

(A) BEFORE (B) AFTER (C) EDGE·CNT (D) EDGE·PTR (E) ENA0 / ENA1 / ENA2 / ENA3

(F) VT1 / VT2 / VT3 / VT4

(G) TIMING SET DATA: t1O / t3O / t1E / t3E (H) FCDATA: t1O / t3O / t1E / t3E (I) USER SET (J) OUT (K) EDGE

FIG.8 (Prior Art)

REAL TIME SELECTOR

| GATE-T1 | GATE-T2 | GATE-SET | HR-SET |
|---------|---------|----------|--------|
| 0 | 0 | 0 | 0 |
| 0 | 1 | 1 | HR-T2 |
| 1 | 0 | 1 | HR-T1 |
| 1 | 1 | 1 | HR-T1 or HR-T2 |

FIG.9

EDGE DETECTOR

| Prev PS | PR | Current S | R | ENA |
|---------|----|-----------|----|-----|
| 0 | 0 | 0 | 0 | 0 |
| 0 | 0 | 0 | 1 | 1 |
| 0 | 0 | 1 | 0 | 1 |
| 0 | 0 | 1 | 1 | x |
| 0 | 1 | 0 | 0 | 0 |
| 0 | 1 | 0 | 1 | 0 |
| 0 | 1 | 1 | 0 | 1 |
| 0 | 1 | 1 | 1 | x |
| 1 | 0 | 0 | 0 | 0 |
| 1 | 0 | 0 | 1 | 1 |
| 1 | 0 | 1 | 0 | 0 |
| 1 | 0 | 1 | 1 | x |
| 1 | 1 | x | x | x |

FIG.10

ENA-VT & ENA-CNT CONVERTER

| ENA0 | ENA1 | ENA2 | ENA3 | EDGCNT | VT1 | VT2 | VT3 | VT4 |
|---|---|---|---|---|---|---|---|---|
| 0 | 0 | 0 | 0 | 0 | · | · | · | · |
| 0 | 0 | 0 | 1 | 1 | 3 | · | · | · |
| 0 | 0 | 1 | 0 | 1 | 2 | · | · | · |
| 0 | 0 | 1 | 1 | 2 | 2 | 3 | · | · |
| 0 | 1 | 0 | 0 | 1 | 1 | · | · | · |
| 0 | 1 | 0 | 1 | 2 | 1 | 3 | · | · |
| 0 | 1 | 1 | 0 | 2 | 1 | 2 | · | · |
| 0 | 1 | 1 | 1 | 3 | 1 | 2 | 3 | · |
| 1 | 0 | 0 | 0 | 1 | 0 | · | · | · |
| 1 | 0 | 0 | 1 | 2 | 0 | 3 | · | · |
| 1 | 0 | 1 | 0 | 2 | 0 | 2 | · | · |
| 1 | 0 | 1 | 1 | 3 | 0 | 2 | 3 | · |
| 1 | 1 | 0 | 0 | 2 | 0 | 1 | · | · |
| 1 | 1 | 0 | 1 | 3 | 0 | 1 | 3 | · |
| 1 | 1 | 1 | 0 | 3 | 0 | 1 | 2 | · |
| 1 | 1 | 1 | 1 | 4 | 0 | 1 | 2 | 3 |

FIG.11

EDGE SELECT TABLE

| EDGE PTR | t1O | t3O | t1E | t3E |
|---|---|---|---|---|
| 0 | VT1 | VT2 | VT3 | VT4 |
| 1 | VT4 | VT1 | VT2 | VT3 |
| 2 | VT3 | VT4 | VT1 | VT2 |
| 3 | VT2 | VT3 | VT4 | VT1 |

SEMICONDUCTOR TEST SYSTEM

FIELD OF THE INVENTION

This invention relates to a semiconductor test system for testing semiconductor devices with high speed, and more particularly, to a semiconductor test system which can operate in a pin multiplex mode to generate test signals higher than two times of more than a repetition rate of a reference clock signal without involving limitations existed in the conventional technology.

BACKGROUND OF THE INVENTION

The semiconductor test system of the present invention is directed to a test system having a function of a pin-multiplex mode. In a pin-multiplex mode, test signals of a plurality of tester channel (test pin) are multiplexed in a time sequential manner so that the test signal of high repetition rate can be generated for testing a semiconductor device. Thus, a pin-multiples mode in the semiconductor test system functions in a manner similar to a parallel-serial conversion process.

Such a pin-multiplex mode is typically performed in a per-pin structured test system. Such a semiconductor test system is also called a per-pin IC tester. Here, a per-pin IC tester refers to a semiconductor test system wherein all of the hardware resource for generating test parameters such as signals are independently provided for each test channel (tester pin) of an IC tester. Consequently, in a per-pin IC tester, various test parameters for a semiconductor devices under test (DUT) can be set independently for each pin of the DUT. Although the present invention is advantageously applicable to the per-pin IC tester, it is also feasible to other types of semiconductor test system such as a shared resource type IC tester.

In testing semiconductor devices such as ICs and LSIs by a semiconductor test system, such as an IC tester, a semiconductor IC device to be tested is provided with test signals produced by an IC tester at its appropriate tester pins (channels) at predetermined test timings. The IC tester receives output signals from the IC device under test generated in response to the test signals. The output signals are strobed by strobe signals with predetermined timings to be compared with expected data to determine whether the IC device properly performs the intended functions.

Typically, timings of the test signals and strobe signals are defined relative to a tester rate or a tester cycle of the IC tester. Generally, the various timings of the tester cycles, test signals and strobe signals are generated based on a reference clock. The reference clock is produced by a high stability oscillator, for example, a crystal oscillator provided in the IC tester. When the required timing resolution in an IC tester is equal to or an integer multiple of the highest clock rate (one clock cycle) of the reference clock oscillator, variety of timing signals can be generated by simply dividing the reference clock by a counter or a divider.

However, IC testers are usually required to have timing resolution higher than the highest clock rate, i.e., the shortest time period, of the reference (system) clock. For example, in the case where a reference clock cycle used in an IC tester is 10 ns (nanosecond), but the IC tester needs to have timing resolution of 0.3 ns or higher, it is not possible to achieve such timing resolution by simply applying or dividing the reference clock.

To generate such timing signals, it is known in the prior art that such timings are described by timing data in a test program. For describing the timings with the resolution higher than the reference clock rate, the timing data is described by a combination of an integer multiple of the reference clock time interval (integral part) and a fraction of the reference clock cycle (fractional part). Such timing data is stored in a timing memory and read out at each cycle of the test cycle. Thus, in each test cycle, test signals and strobe signals are generated with reference to the test cycle, such as a start point of each cycle, based on the timing data.

FIG. 4 is a schematic block diagram showing an example of a conventional semiconductor test system. The example of FIG. 4 shows a basic configuration of a semiconductor test system having a shared resource structure. A pattern generator 2 generates a test pattern to be provided to a DUT (device under test) 9 and an expected value pattern to be provided to a pattern comparator 7. A timing generator 3 generates a timing pulse signal to synchronize the timing of the whole system, and provides the timing pulse signal to the pattern generator 2, the pattern comparator 7, a wave formatter 4, an analog comparator 6.

The timing generator 3 provides the timing pulse (tester rate pulse) and timing data to the wave formatter 4. Based on the pattern data from the pattern generator 2 and the timing pulse and timing data from the timing generator 3, the wave formatter 4 forms a test signal having a specified waveform and timings and provides the test signal to a driver 5. The pattern data is also called format control data (FCDATA) which defines rising and falling edges of the test signal waveform. The timing data (timing set data) defines timings (delay times) of the rising and falling edges of the waveform relative to the test cycle. Although not shown in FIG. 4, the wave formatter 4 includes a set/reset flip-flop to form the test signal to be provided to the driver 5. The driver 5 regulates the amplitude of the test signal to a predetermined level and applies the test signal to the DUT 9.

A response signal from the DUT 9 is compared with a reference voltage at a predetermined strobe timing by the analog comparator 6. The resultant logic signal is provided to the pattern comparator 7 wherein a logic comparison is performed between the resultant logic pattern from the analog comparator 6 and the expected-value pattern from the pattern generator 2. The pattern comparator 7 checks whether two patterns match with each other or not, thereby determining pass or failure of the DUT 9. When a failure is detected, such fail information is provided to a fail memory 8 and is stored along with the information of the failure address of the DUT 9 from the pattern generator 2 in order to perform failure analysis later.

To generate each signal to perform the foregoing operations, a memory is provided with a data table that stores data in each of the pattern generator 2, the timing generator 3, and the wave formatter 4. The data in the data table is formed by a test program that a user or programmer has produced based on the specifications of the DUT 9. The test program is provided to each unit in the IC tester from a test processor 1 through a tester bus in FIG. 4. Thus, the test processor 1 controls an overall operation of the test system based on the test program. In the table of the pattern generator 2, test pattern data for a plurality of channels is provided, thereby allocating the pattern data to each of the terminal pins 1-n of the DUT 9.

The memory in the timing generator 3 includes a rate set table and a clock set table. The rate set table stores the rate data indicating the tester rate or test cycle (may also be referred to as "RATE"). The clock set table stores timing data showing the timings (delay times) of edges in a test signal waveform to be produced by the wave formatter 4.

For example, the delay times are defined with reference to the start point of the test cycle. Such rate data and timing data are provided from the pattern generator 2 to the timing generator 3 prior to the start of the test operation. In contrast, pattern data showing the edges in the test signal waveform is provided in real time to the timing generator 3.

Thus, the timing generator receives the timing data (timing set data) in advance while it receives the pattern data (format control data FCDATA or edge data) during the operation. Based on the timing data and pattern data, the timing pulse (tester rate pulse) and the timing data are generated by the timing generator 3 which are provided to the wave formatter 4 to form the test signals. In general, various combinations of the above data are used to generate test signals of complex waveforms.

As noted above, a modern semiconductor test system needs to generate test signals with the timing resolution higher than a reference clock cycle. Thus, the delay data generated by the timing generator 3 is described by a combination of an integer multiple of the reference clock cycle (integral part) and a fraction of the reference clock cycle (fractional part). For example, the fractional part data shows delay time resolution of ½, ¼, ⅛, 1/16 of the reference clock cycle. Within the context of the present invention, the timing data may also be referred to as HR (high resolution) data or a HR signal. Typically, the delay time indicated by the integral part of the timing data HR is produced by counting the integral part data. The delay time indicated by the fractional part of the timing data HR is produced by an analog type variable delay circuit.

In the data table of the wave formatter 4, data relating to waveform modes are provided. Such waveforms include a return-to-zero (RZ) waveform, a non-return-to-zero (NRZ) waveform and an exclusive OR (EOR) waveform. The test signal is created by combining the pattern data (format control data or edge data) from the pattern generator 2 and timing (rate) pulses and timing data (delay time data) from the timing generator 3, and the waveform data in the wave formatter 4. The test signal is provided to the driver 5 whereby incorporating a predetermined amplitude.

Because of the advancement in the semiconductor IC technology, IC devices to be tested are becoming more and more complicated and high speed as well as high density. To test such IC devices, an IC tester has to be able to generate complicated test patterns at high speed. The IC tester having the shared resource structure such as shown in FIG. 4 is considered economical but not enough to test recent IC devices with high complexity and high speed. Here, the shared resource IC tester refers to a tester in which tester resources such as a timing generator and reference voltages are commonly used for all tester channels (test pins).

In contrast, an IC tester of a per-pin structure is considered more appropriate to test such complicated and high speed IC devices. The per-pin tester refers to a tester which is capable of independently set test parameters to be applied to the DUT 9 for each pin. In other words, a per-pin structured IC tester has tester resources such as a timing generator for each tester pin (channel) separately from the other tester pins.

Compared to the shared resource tester that shares the test parameters for each terminal pin of the DUT 9, the per-pin tester is better suited for testing high speed LSIs since a complex test pattern and timing can be generated more freely since it can produce the test parameters for each terminal pin of the DUT 9 independently from the other pins. In a typical per-pin IC tester, the timing generator 3 and wave formatter 4 in FIG. 4 are allocated to each tester pin, i.e., to each terminal pin of the DUT 9.

FIG. 5 is a block diagram showing an example of a conventional per-pin IC tester. The example of FIG. 5 is directed to the structure of one tester pin for generating a test signal for a terminal pin of a DUT. The per-pin tester includes a waveform memory (WFM) 11, a timing generator 3, a real time selector 12, and a wave formatter 4. The wave formatter 4 supplies a test signal to a driver such as shown in FIG. 5 to determine the amplitude thereof before being provided to a device under test (DUT).

The waveform memory (WFM) 11 receives test pattern data from the pattern generator 2, and transmits pattern data and timing data to a timing generator 3. The pattern data is also called format control data (FCDATA) or edge data which defines rising and falling edges of the test signal waveform. The timing data (timing set data) defines timings (delay times) of the rising and falling edges of the waveform relative to the test cycle. The timing generator 3 receives the timing data (timing set data) in advance while it receives the pattern data (format control data FCDATA or edge data) during the operation.

In this example, two groups (T1 and T2) of edge data showing set and reset timings are provided to the timing generator 3. Namely, a set timing T1S, a reset timing T1R, a set timing T2S and a reset timing T2R as shown in FIG. 5. These set and reset timings are ultimately used in the wave formatter 4 to produce a test signal by driving a set/reset flip-flop therein with the defined timings. In other words, the set and reset timings determine timings of rising and falling edges of the test signal waveform within a tester rate (test cycle). It should be noted that, in the standard operation of the IC tester, one of T1S or T1R and one of T2S or T2R can be validly used in one test cycle.

Based on the timing data and edge data (format control data) from the waveform memory 11, the timing generator 3 produces a timing pulse (also referred to as a gate signal GATE) and high resolution (HR) timing data. Typically, the timing pulse (gate signal) defines a start point of the tester rate (test cycle) and the timing data HR defines a delay time of the set or reset signal relative to the timing pulse. The timing generator 3 allocates the timing pulses and the timing data HR to a set signal path and a reset signal path of the wave formatter 4 via the real time selector 12.

More particularly, the timing generator 3 produces, in synchronism with the reference clock (not shown), the gate signal (timing pulse) GATE, the high resolution timing data HR, and the group select signal (not shown). Based on the group select signal, either one of the groups T1 or T2 of the timing generator is selected. As noted above, the gate signal GATE defines a reference timing (for example, a start of each test cycle) for rising and falling edges of the test signal. The timing data HR shows a delay time of the edges of the test signal waveform with reference to the gate signal GATE. The delay time defined by the timing data HR includes an integer multiple of the reference clock cycle and a fraction of the reference clock cycle.

The real time selector 12 selects and provides the gate signal GATE and the timing data HR to a set signal path or a reset signal path in the wave formatter 4. An example of the allocation of the timing pulse and the timing data HR through the real time selector 12 is shown in a truth table of FIG. 8, which is directed to the set signal path. Although not shown, the same allocation is also applicable to the reset signal path. This table shows that the logical combinations of GATE-T1 and GATE-T2 in the left part of the table determine the timing pulse (GATE-SET) and the timing data (HR-SET) in the right part of the table to be provided to the set signal path in the wave formatter 4.

As shown in the table of FIG. 8, when the gate signal (GATE-T1) of the group T1 is "0" and the gate signal (GATE-T2) of the group T2 group is "0", the timing pulse (GATE-SET) and the timing data HR are "0". Here, "0" indicates non-existence while "1", indicates existence. When the GATE-T1 is "0" and the GATE-T2 is "1", the timing pulse (GATE-SET) and the timing data HR of the group T2 are provided to the wave formatter 4. When the GATE-T1 is "1" and the GATE-T2 is "0", the timing pulse (GATE-SET) and the timing data HR of the group T1 are provided to the wave formatter 4. If the GATE-T1 and GATE-T2 are "1", timing pulse (GATE-SET) and smaller one of the timing data HR-T1 or HR-T2 are provided to the wave formatter 4.

The wave formatter 4 generates a set signal in the set signal path and a reset signal in the reset signal path. In FIG. 5, the set signal path is the upper half of the wave formatter 4 and the reset signal path is the lower half of the wave formatter 4. The set signal and reset signal are provided to a set/reset flip-flop 13. Each of the set and reset signal paths includes a coarse delay circuit 14 and a fine delay circuit 18, a register 17, an accumulator 17, and an AND gate 15. The coarse delay circuit 14 produces a delay time defined by the integral part of the timing data HR. The fine delay circuit 18 adds a delay time defined by the fractional part of the timing data HR to the output signal of the coarse delay circuit 14. If necessary, the register 16 provides a delay time to the accumulator 17 for adjusting skews (timing difference) between test channels.

The coarse delay circuit 14 is formed, for example, of a down counter for counting the number of the reference clock pulse defined by the integral part of the timing data. The integral part of the timing data is received through the higher bits of the output of the accumulator 17. Thus, the coarse delay circuit 14 produces a set signal which is delayed by the integer multiple of the reference clock cycle defined by the timing data HR. The AND gate 15 is provided for retiming the set signal from the delay circuit 14.

Based on the fractional part delay data received through the higher bits of the timing data HR, the fine delay circuit 18 provides a delay time smaller than one cycle of the reference clock to the set signal from the coarse delay circuit 14. The fine delay circuit 18 is an analog delay circuit formed, for example, of series connected CMOS gates. Thus, the set signal having a delay time defined by the timing data HR is supplied to the set/reset flip-flop 13 to produce a rising edge of the test signal. In the same manner, the reset signal having a delay time defined by the timing data HR is supplied to the set/reset flip-flop 13 to produce a falling edge of the test signal.

In the foregoing, it should be noted that an IC tester cannot produce a signal having a time interval smaller than one cycle of a reference clock. One of the reasons is that each and every operation in the IC tester is synchronized with the reference clock so that a signal having a repetition rate smaller than the reference clock is not discernible by the system. The reference clock is the smallest time unit in terms of the synchronized operation in the test system. Therefore, if the time interval of two set signals smaller than the reference clock cycle is provided to the same set signal path, such set signals cannot properly produce an intended edges in the test signal. This is true for the reset signals in the reset signal path as well.

FIG. 6 is a timing chart showing the operation of the IC tester of FIG. 5. In this example, the tester rate (test cycle) RATE of FIG. 6(A) has a time length of four cycles of the reference clock REFCLK of FIG. 6(B). The pattern of FIG. 6(C) is a test pattern specified by the user. The user specified test pattern shows the set edge data T1S handled by the group T1 timing generator and the reset edge data T2R handled by the group T2 timing generator in the first test cycle. In the second test cycle, the test pattern shows the set edge data T2S handled by the group T2 timing generator and the reset edge data T1R handled by the group T1 timing generator. The allocation of the timing edges (edge data) and the groups of timing generators are freely specified by the user of the IC tester so long as one edge by one group of timing generator is specified in one test cycle.

The GATE SET of FIG. 6(D) in this case is an output signal of the coarse delay circuit 14 in the set signal path of the wave formatter 4 which is delayed by an integer multiple of the reference clock cycle. The fractional part of the timing data HR shown in FIG. 6(E) defines a fine delay time smaller than one cycle of the reference clock. The fine delay time is added to the GATE SET of FIG. 6(D) by the fined delay circuit 18 so that the set signal of FIG. 6(F) is produced.

Similarly, the GATE RES of FIG. 6(G) in this case is an output signal of the coarse delay circuit in the reset signal path of the wave formatter of FIG. 5 which is delayed by an integer multiple of the reference clock cycle. The fractional part of the timing data HR shown in FIG. 6(H) defines a fine delay time smaller than one cycle of the reference clock. The fine delay time is added to the GATE RES of FIG. 6(G) by the fined delay circuit so that the reset signal of FIG. 6(I) is produced.

By the set signal and reset signal formed in the foregoing, the flip-flop 13 produces an output (test) signal of FIG. 6(J) having the edge timings specified by the user. The set and reset signals in the second test cycle are produced in the manner similar to the above. In this example, since the pulse interval in the set signal path or reset signal path is greater than the reference clock cycle, the intended timing edges in the test signal can be produced at the output of the flip-flop 13.

In the conventional semiconductor test system shown in FIGS. 4–6, there arises a problem for generating a test signal having desired edge timings when the system is in a high speed operation such as a pin multiplex mode. For example, when the time interval between two edges in the same path (set signal path or reset signal path) is smaller than one cycle of the reference clock, the system cannot properly produce such edges because of the reason noted above.

To fully evaluate the high speed IC devices, a per-pin structured IC tester is designed to operate in a pin-multiplex mode for achieving a high speed test pattern generation. In such a pin-multiplex mode, test signal edges for a plurality of tester channels (device pins) are combined so that the repetition rate (number of edges) of the test signal is increased in proportion to the number of tester channels multiplexed.

FIG. 7 shows a timing relationship in the pin multiplex mode operation in the conventional IC tester. In this example, it is assumed that the test cycle (tester rate RATE) is set to the highest rate in which the test cycle is almost the same as the reference clock cycle. Thus, as shown in. FIGS. 7(A) and 7(B), the test cycle RATE and the reference clock REFCLK show substantially the same time length. The intended output signal OUT is shown in FIG. 7(C) where timing edges for two test channels (odd O and even E channels) are multiplexed.

In this example, in the first half of the first test cycle designated by $a_F$ and $a_L$, the timing edges T1O and T3O of the odd tester channel (pin) are used. In the second half of the first test cycle designated by $b_F$ and $b_L$, the timing edges T1E and T3E of the even tester channel (pin) are used. Further, in the second test cycle, FIG. 7(C) shows the first timing edge T1O. The timing edges T1O and T3O are respectively allocated to the former half $a_F$ and latter half $a_L$ of the first half test cycle. The timing edges T1E and T3E are respectively allocated to the former half $b_F$ and latter half $b_L$ of the second half test cycle. References T1 and T3 indicate two timing generator groups such as shown in FIG. 5 by T1 and T2.

In this example, as shown in FIG. 7(C), there arises a situation where the time interval K of the two rising edges (set signals) T3O and T1O is smaller than one cycle period of the reference clock. Since signals in the same signal path (set signal path in this case) having the time interval smaller than the reference clock cycle is not discernible as described in the foregoing, the IC tester cannot generate the intended test signal of FIG. 7(C). Therefore, there is a need for a semiconductor test system to overcome this problem so that any timing settings by the user can produce a test signal of intended timing edges.

SUMMARY OF THE INVENTION

It is, therefore, an object of the present invention to provide a semiconductor test system which is capable of generating a test signal having a time interval between the timing edges of the same direction which is smaller than one cycle of the reference clock.

It is another object of the present invention to provide a semiconductor test system which is capable of generating a high speed test signal by multiplexing timing edges of a plurality of tester channels.

It is a further object of the present invention to provide a semiconductor test system which is capable of detecting inappropriate settings in the edge data by the users and allocating the edge data so that an intended edge is produced in a different signal path in the test system.

It is a further object of the present invention to provide a semiconductor test system which is capable of generating an intended test pattern in a pin multiplex mode even when the edge data set by the user is inappropriate.

In the present invention, edge data is detected whether the current edge data is the same as the previous edge data, and if so, the current pattern edge is removed from the user specified time position and shifted to the time position where there is an actual change of edge in the test signal waveform. As a result, the situation where the time interval smaller than the reference clock in the same signal path can be obviated.

The semiconductor test system of the present invention for testing a semiconductor device includes a waveform memory for storing edge data which defines edges of a test signal waveform to be supplied to a semiconductor device under test based on a test program, a timing generator for generating timing data and a timing pulse for each test cycle, a wave formatter for generating a set signal and a reset signal for producing the test signal waveform in response to the timing data and the timing pulse from the timing generator, and a virtual timing generator provided between the waveform memory and the timing generator for detecting a relationship between previous edge data and current edge data from the waveform memory corresponding to each of the set signal and the reset signal and removing the current edge data when the current edge data is the same as the previous edge data and allocating the current edge data to a time position where there is an actual change of edge in the test signal waveform.

BRIEF DESCRIPTION OF THE DRAWINGS

FIG. 3 is timing chart showing the operation for producing the timing edges in the semiconductor test system of the present invention.

FIG. 8 is a truth table for allocating the timing pulses and the timing data to the wave formatter in the semiconductor test system of FIG. 5.

FIG. 9 is a truth table for detecting the relationship between edge data in the previous cycle and current cycle of the edge detector in the present invention.

FIG. 10 is a truth table for converting edge enable signals to edge numbers by the virtual timing generator of the present invention.

FIG. 11 is a truth table showing the order of selecting the edge data by the virtual timing generator of the present invention.

DESCRIPTION OF THE PREFERRED EMBODIMENTS

Figure 1:
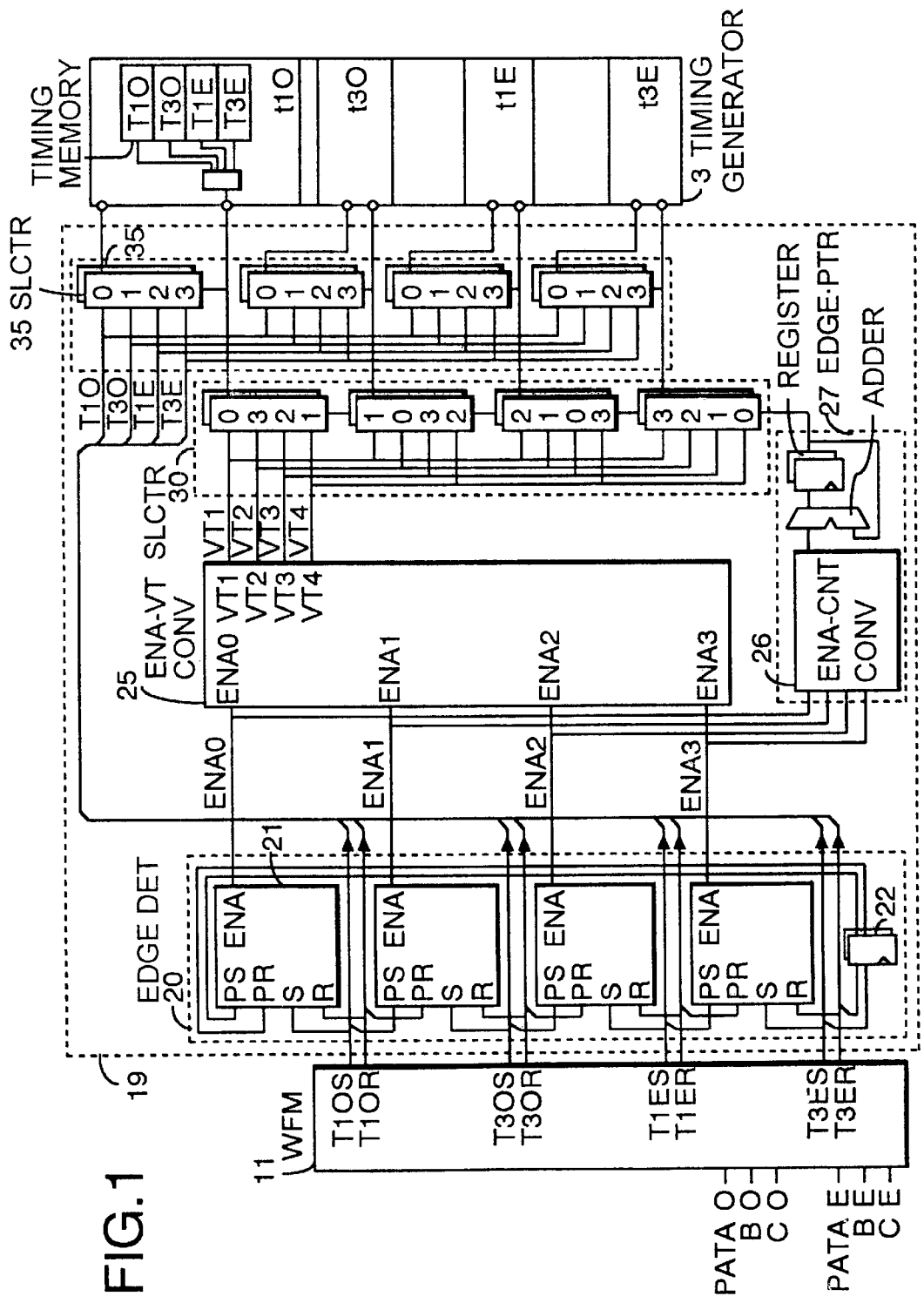
FIG. 1 is a schematic block diagram showing an example of configuration of the semiconductor test system of the present invention.
Figure 5:
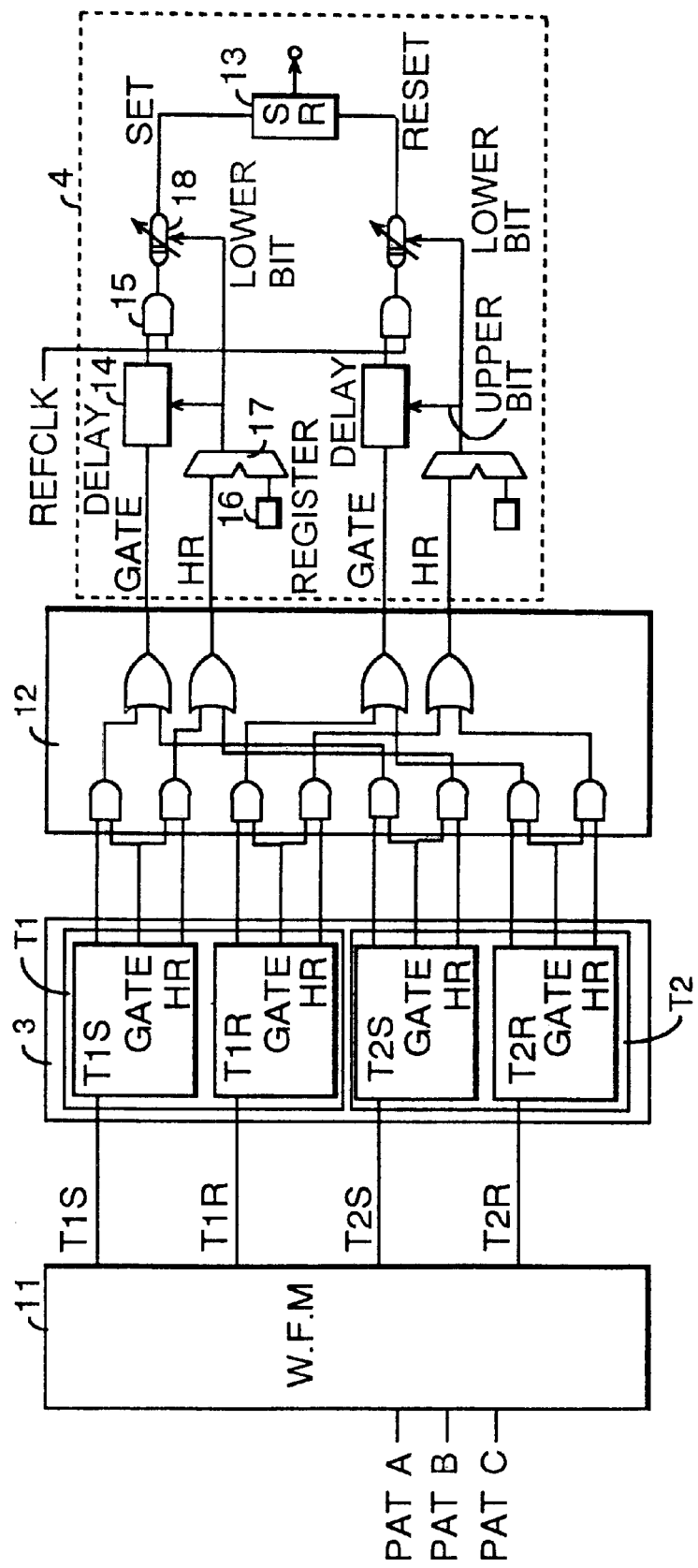
FIG. 5 is a schematic block diagram showing a basic structure of a per-pin type semiconductor test system in the conventional technology.
Figure 6:
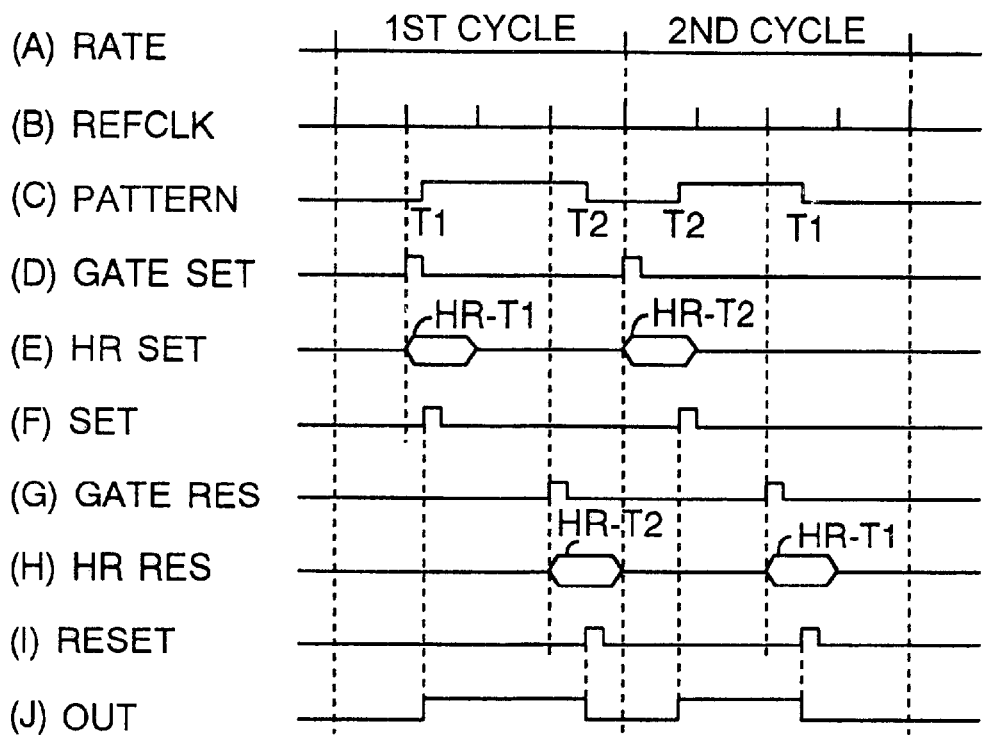
FIG. 6 is a timing chart showing the waveforms and timing relationships in the per-pin type semiconductor test system of FIG. 5.

An embodiment of the present invention is shown in FIG. 1. The semiconductor test system of the present invention includes a virtual timing generator 19 between the waveform memory (WFM) 11 and the timing generator 3. Other structure of the test system is basically the same as that of the conventional example such as shown in FIG. 5.

In this example, the virtual timing generator 19 functions in the following manner. First, the virtual timing generator 19 detects the relationship between the previous edge data and the current edge data in the user defined pattern for each of the set signal path and the reset signal path. When the current edge data is the same as the previous edge data, the current pattern edge is removed from the user specified time position and shifted to the time position where there is an actual change of edge in the test signal waveform. When shifting the edge in the above, the edge type (set or reset) is reversed, i.e., from set to reset, or from reset to set.

Figure 7:
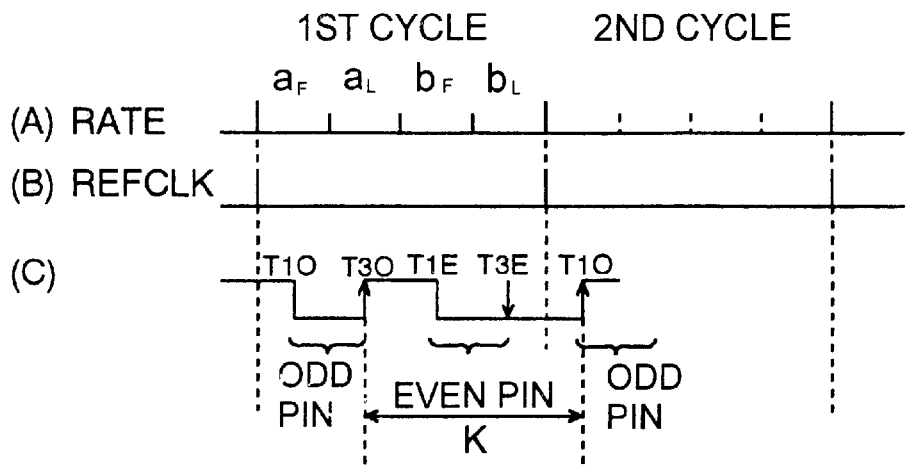
FIG. 7 is a timing chart showing the waveforms and timing relationships in the pin multiplex mode of the semiconductor test system of FIG. 5.

Referring back to the timing chart of FIG. 7, the conventional test system has a problem for not being able to generate the user specified edges in the test signal when a certain situation arises in the pin-multiplex mode. As noted above, the pin-multiplex mode increases the repetition rate of the test pattern by alternately combining the timing edges of a plurality of test channels (pins). In the example of FIG. 7, timing edges of two tester pins (test channels) are multiplexed to produce a test signal of two times faster than a test signal in a single channel.

In the pin multiplex mode, however, when the two edges in the same type (requiring the same signal path such as in the wave formatter) are apart from one another by less than one reference clock cycle, the test system is incapable of generating the intended edges. This is because the overall test system is synchronized with the reference clock as noted above. In the example of FIG. 7(C), since the time interval K between the two set edges (set signals) T3O and T1O is smaller than the reference clock cycle of FIG. 7(B), the set edge T1O in the second cycle is not properly produced by the test system.

It should be noted that, in the example of FIG. 7(C), the even edge data T3E (reset edge) is useless data because the previous data T1E already shows the reset edge. Such useless edges can be set by the user since the test system allows any timing edge settings so long as one edge by one timing generator group is specified in one test cycle. If the edge data T3E were positioned at the T1O as a set edge rather than a reset edge, there should not have been the problem noted above since the set edges are processed by different (even and odd) set signal paths.

Based on this background, the virtual timing generator 19 of the present invention is provided to solve the problems in the conventional semiconductor test system. The virtual timing generator 19 is comprised of the following elements:

(A) an edge detector 20 which detects whether two adjacent (previous and current) edge data transmitted from the waveform memory (WFM) 11 within one test cycle (tester rate) are identical or not. If they are identical to one another, then the latter edge is considered useless. If they are different from one another, then the latter edge is considered useful, i.e., showing an actual change in the waveform. When such a useful edge is detected, the edge detector 20 produces an enable (ENA) signal.

(B) an ENA-VT converter 25 which converts the enable signals from the edge detector 20 into virtual timing signals (edge data numbers) which indicate pattern edges for truly changing the test signal waveform.

(C) an edge pointer (EDGE-PTR) 27 which denotes the edge point (select signal) of the next test cycle. The edge pointer 27 includes an ENA-CNT converter 26 which counts the number of the enable signals and an accumulator for adding the current data to the last data.

(D) a selector 30 which selects the output of the ENA-VT converter 25 based on the output signal of the edge pointer 27 and provides the selected edge data number to the timing generator 3.

(E) a selector 35 which selects either set command or reset command from the waveform memory 13 and supplies the selected command to the timing generator 13.

The edge detector 20 can be configured by a match (coincidence) circuit that compares the previous edge signal and current edge signal from the waveform memory 13. The flip-flop 22 is to temporarily hold the last data in the previous test cycle and to adjust the timing in the operation of the edge detector 20. The edge detector 20 compares current set signal with the previous set (PS) signal as well as the current reset signal with the previous reset (PR) signal. If there is a mismatch, the edge detector sets an enable (ENA) signal to "1" indicating that the current edge data should be used. If there is a match, the edge detector sets the ENA signal to "0" indicating that the current edge data is useless.

The relationship between the edge signals (data) and the ENA signals to be detected by the edge detector 20 is shown in the truth table of FIG. 9. In the truth table of FIG. 9, when the previous set signal PS is "1" and the current set signal S is also "1", then the ENA signal is set to "0" since the test pattern will not be truly changed by the current set signal (set edge data) S. Similarly, when the previous reset signal PR is "1" and the current reset signal R is also "1", then the ENA signal is set to "0" since the test pattern will not actually change by the current reset signal (reset edge data) R. In the table 2, it is assumed that both set and reset signals should not be set to "1" at the same time. Thus, if such a setting is found, the ENA signal is set to "X" indicating meaningless.

The ENA signal is produced corresponding to each of the set and reset signals (edge data). For example, in FIG. 1, enable outputs ENA0–ENA3 are provided corresponding to edge data T1O, T3O, T1E, and T3E, respectively. In FIG. 1, references labels T1 and T3 indicate two timing generator groups such as t1 and t3 in the timing generator 3. Further, the reference labels O and E in the edge data indicate and an odd tester channel (test pin) and an even tester channel (test pin).

The ENA-VT converter 25 receives the ENA signals from the edge detector 20, and assigns edge numbers to the corresponding set and reset signal edge data. Thus, when the ENA signals (ENA0, ENA1, ENA2, or ENA3) showing "1" are received from the edge detector 20, data showing the edge numbers (0, 1, 2, 3) is output at the corresponding output terminals (VT1, VT2, VT3, VT4) of the converter 25. In this arrangement, the ENA signal showing "1" from the edge detector 20 is directed to the edge data that truly changes X the test pattern. Thus, at the output terminals (VT1, VT2, VT3, VT4) of the converter 25, the useless edge signals are removed from the original time positions and only the truly necessary edges are specified. The ENA-VT converter 25 can be configured by a plurality of gate circuits.

FIG. 10 is a truth table showing the relationship between the enable signals ENA and the edge numbers at the output terminals VT1–VT3 to be determined by the converter 25 of the present invention. As shown in the truth table, at the ENA-VT converter 25, the edge numbers are allocated to the plurality of VT output terminals based on the ENA signals showing "1". For example, if the outputs of the ENA0–ENA3 signals are 1, 1, 0, 1, then the edge numbers 0, 1, 3, X (non), are allocated for the terminals VT1-VT4.

The ENA-CNT converter 26 counts the number of truly necessary edge signals (data) based on the edge enable signals ENA produced by the edge detector 20. Thus, as shown in the table of FIG. 10, a column designated by EDGCNT shows the number of edges obtained by counting the number of the enable signals ENA0–ENA3 showing "1".

The edge pointer 27 produces a select signal for selecting the output terminal VT for the next test cycle by the selector 30. The edge pointer 27 is configured by the ENA-CNT converter 26 and the accumulator. The accumulator receives the number of edge signals associated with the actual changes of edges in the test signal from the ENA-CNT converter 26. The output of the accumulator is provided to the selector 30 as a select signal. The ENA-CNT converter 26 can be formed of a counter and the accumulator can be formed of a register and an adder as shown in FIG. 1.

The edge pointer 27 adds the previous count data to the current count data to determine the VT terminal to be selected in the next test cycle. Based on the select signal from the edge pointer 27, the selector 30 selects the specified VT terminal of the ENA-VT converter 25 to provides the edge number to the timing generator 3.

The relationship between the output of the edge pointer 27 and the edge data to be specified by the edge number defined by VT0–VT3 terminals is shown in the truth table of FIG. 11. As shown in the table, if the select signal from the edge pointer 27 is "0", the real edge data is activated in the order of VT1, VT2, VT3, and VT4. Similarly, if the edge pointer 27 indicates "1", the real edge data is activated in the order of VT4, VT1, VT2, and VT3. If the select signal shows "2", the real edge data is activated in the order of VT3, VT4, VT1, and VT2. If the edge pointer indicates "3", the real edge data is activated in the order of VT2, VT3, VT4, and VT1.

The operation of the semiconductor test system of the present invention is described in the following. Prior to the start of the test pattern generation, the timing generator 3 receives a set of timing data from the waveform memory through a tester bus (not shown). The timing data for each edge is formed of an integral part showing a delay time of an integer multiple of the reference clock cycle and a fractional part showing a delay time of smaller than one cycle of the reference clock. Based on the edge number defined by the selected VT output, the set or reset signal having a prescribed delay time is generated by the wave formatter such as shown in FIG. 5.

Figures 2A, 2B:
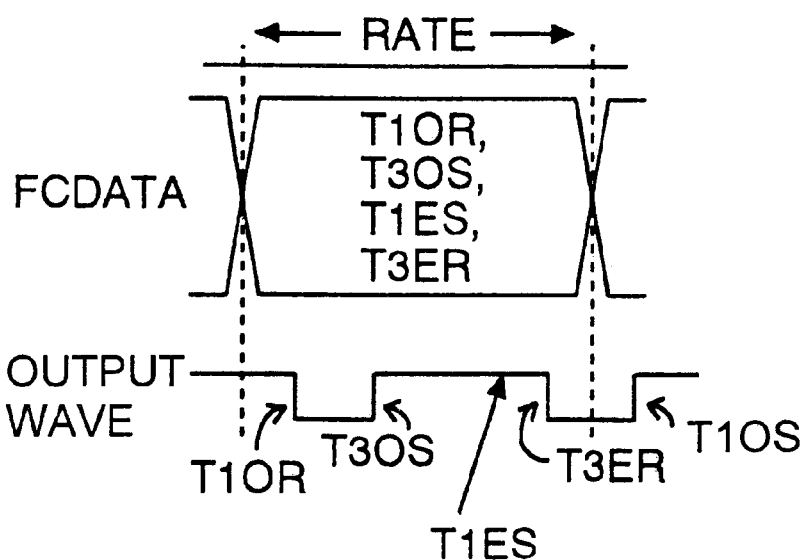
FIGS. 2A and B are timing charts showing a waveform and timing relationship in the pin multiplex mode of the semiconductor test system of the present invention.
Figure 4:
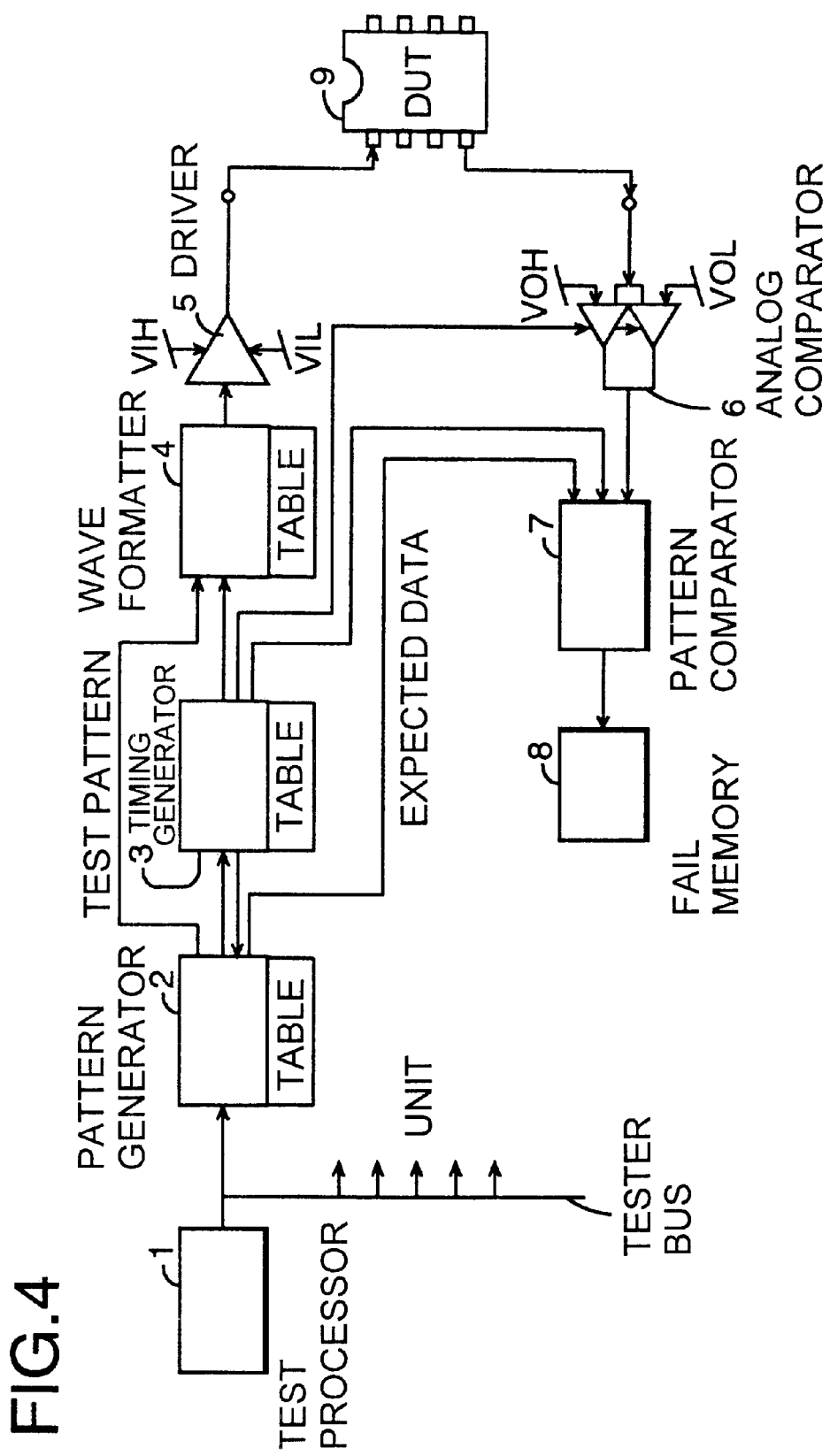
FIG. 4 is a schematic block diagram showing a basic structure of a shared resource type semiconductor test system in the conventional technology.

FIGS. 2A and 2B are timing diagram showing an example of operation in the semiconductor test system of the present invention. Since this example is directed to the pin multiplex mode for two channels (pins), edge data, i.e., format control data (FCDATA) in one test cycle (RATE) includes two timing edges of odd channel and two timing edges of even channel. Such format control data FCDATA from the waveform memory 11 is received by the edge detector 20 in the virtual timing generator 19 of FIG. 1.

In the example of FIG. 2A, pattern edges T1OR, T3OS, T1ES, and T3ER are specified by the user as the format control data (FCDATA) in the first test cycle (RATE). Here, T1OR is directed to a reset signal in the odd channel, T3OS is directed to a set signal in the odd channel, T1ES is directed to a set signal in the even channel, and T3ER is directed to a reset signal in the even channel. Assuming that the first edge in the second test cycle is T1OS (set signal in the odd channel), the intended test signal waveform can be illustrated as shown in FIG. 2B.

It is also assumed that the reference clock cycle is the same as the test cycle. Under the circumstances, similar to the situation in FIG. 7(C), the time interval between two set signals defined by T3OS and T1OS is smaller than the reference clock cycle. Since the two set signals are to be generated by the same set signal path in the odd channel and the time interval between the two is smaller than the reference clock cycle, it is not possible to produce such timing edges by the test system.

It should also be noted that the edge data T1ES shows a set signal which is the same as the previous edge data T3OS. Thus, the edge data T1ES is useless because this edge date will not contribute to any actual change in the test signal waveform. Further, because of this useless edge data, the same type signals (in this case, set signals by T3OS and T1OS) are assigned in the same channel (odd channel), making it impossible to generate the specified waveform.

The virtual timing generator 19 of FIG. 1 is to solve the problems involved in the situations of FIG. 2A or FIG. 7(C). The situation identical to that of FIG. 2A is also shown in FIG. 3(A). In order to rectify this problem, the edge data T1E identical to the edge data T3E (both are reset edge in the even channel) in FIG. 2 is detected and removed from the specified time position by the virtual timing generator 19. The virtual timing generator 19 further functions to shift the edge T1E to the time position of the edge T3E as shown in FIG. 3(B).

Accordingly, the edge T3E is also shifted to the time position of T1O in the next test cycle. Hence, the first set signal in the second test cycle is assigned to the even channel in FIG. 3(B) rather than the odd channel in FIG. 3(A). Since the same type edges (set signals in this case) are handled by the different signal paths (edge T1O by the set signal path in the odd channel, edge T3E by the set signal path in the even channel), the intended waveform can be properly produced even the time interval between the two edges is smaller than the reference clock cycle.

In this disclosure, the odd numbered test channel is provided with the edge data T1O and T3O, and the even numbered test channel is provided with the edge data T1E and T3E. Although three or more channels can be multiplexed, only two test channels are multiplexed in the pin multiplex mode operation in the example of FIGS. 1–3. Each test channel includes the wave formatter such as shown in FIG. 5. The output of the two wave formatters are combined to form a series signal (not shown). The order of the edges defined by the user in a test cycle RATE is determined in order to drive the virtual timing generator 19. Such an order of the edges is T1O, T3O, T1E, and T3E and is unchanged throughout the operation.

Test pattern data A, B, C . . . for the odd channel (pin) and test pattern data A, B, C . . . for the even channel (pin) are applied and stored in the waveform memory 11. Based on the test pattern data, the waveform memory supplies the timing data to the pattern generator 3 prior to the operation. Also based on the test pattern data, the waveform memory 11 supplies the format control data (edge data) corresponding to a set (S) signal and a reset (R) signal for each edge to the edge detector 20. Namely, edge data T1OS and T1OR, edge data T3OS and T3OR, edge data T1ES and T1ER, and edge data T3ES and T3ER are provided to the edge detector 20. The information concerning the set and reset signals is also provided to the selector 35 so that the type of edge (set or reset) for the edge selected by the selector 30 is specified in the timing generator 3.

The edge detector 20 compares the edge data with the previous edge data to determine whether the same set edges or same reset edges continue in the user specified edge data. Such a relationship is shown in the truth table of FIG. 9. If the user specified edge data involves an actual change in the waveform/ the enable signal ENA is set to "1". If the user specified edge data involves a useless edge such as T1ES of FIG. 2, the enable signal ENA is set to "0". Thus, the edge detector 20 produces the ENA1–ENA3 as shown in FIG. 3(E) for the edge data of FIG. 3(A).

Upon receiving the ENA signal generated by the edge detector 20, the ENA-VT converter 25 allocates edge number such as "0" for T1O, "1" for T3O, "2" for T1E, and "3" for T3E based on the order of edges determined in the foregoing. However, the edge number is allocated only to the VT terminal corresponding to the edge data involving the actual change in the test signal waveform. The edge number is not allocated to the edge data which is not related to the actual change in the waveform. This relationship is shown in the truth table of FIG. 10. Thus, the ENA-VT converter 25 produces the edge number at the terminals VT1–VT3 as shown in FIG. 3(F) for the edge data of FIG. 3(A).

The ENA signals shown in FIG. 3(E) are also supplied to the edge pointer 27 of FIG. 1. The ENA-CNT converter 26 counts the number of edges that truly change the test signal waveform. The counted data is shown in FIG. 3(C) for the edge data of FIG. 3(A). The counted data from the ENA-CNT converter 26 is added to the previous data by the accumulator in the edge pointer 27. The resultant output (select signal) of the edge pointer 27 is shown in FIG. 3(D). The select signal in the first test cycle is "0". The select signal shows "3", "2", "0" and "3" for the second to six test cycle, respectively, as shown in FIG. 3(D).

The selector 30 allocates the corresponding VT signals to the timing generator 3 based on the select signal from the edge pointer 27. Since the first select signal from the edge pointer 27 is "0", output signals VT1–VT3 showing the edge numbers "0", "1" and "3", respectively, are selected by the selector 30. In response to the edge numbers from the selector 30, the timing generator 3 generates timing data of FIG. 3(G) and format control data of FIG. 3(H).

The timing generator 3 is also provided with edge type (set or reset) data corresponding to the edge data T1O, T3O, T1E and T3E through the selector 35. Thus, based on the designated edge number and the edge type data, the timing generator 3 generates set and reset signals for producing rising and falling edges of the test signal.

Based on the user defined edge data in FIG. 3(I) which is intended to produce the waveform of FIG. 3(A), the output waveform of FIG. 3(J) can be produced by the test system of the present invention. In the present invention, the user specified edges in FIG. 3(I) are changed to the edges of FIG. 3(K) by the test system, thereby making it possible to generate the intended waveform.

In the foregoing, the present invention is explained for the example wherein edge data for the two test channels is multiplexed in the pin multiplex mode. However, the idea of the present invention can be applied to a pin multiplex mode of three test channels or more.

According to the present invention, the semiconductor test system is capable of generating a test signal having a time interval between the timing edges of the same direction which is smaller than one cycle of the reference clock. Thus, the semiconductor test system can generate a high speed test signal by multiplexing timing edges of a plurality of test channels. The semiconductor test system can detect inappropriate settings in the edge data by the users and allocate the edge data so that an intended edge is produced in a different signal path in the test system.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A semiconductor test system for testing a semiconductor device, comprising:

a waveform memory for storing edge data which defines edges of a test signal waveform to be supplied to a semiconductor device under test based on a test program;

a timing generator for generating timing data and a timing pulse for each test cycle, the timing pulse being a time reference of the test cycle and the timing data indicating a delay time relative to the timing pulse, the timing data being produced and stored in the timing generator based on the test program;

a wave formatter for generating a set signal and a reset signal for producing the test signal waveform in response to the timing data and the timing pulse from the timing generator; and a virtual timing generator provided between the waveform memory and the timing generator for detecting a relationship between previous edge data and current edge data from the waveform memory corresponding to each of the set signal and the reset signal and removing the current edge data when the current edge data is the same as the previous edge data and allocating the current edge data to a time position where there is an actual change of edge in the test signal waveform;

wherein a type of edge in the edge data is reversed between a set edge and a reset edge when the virtual timing generator shifts the current edge data to the time position of the actual change in the test signal waveform.

2. A semiconductor test system as defined in claim 1, further comprising a real time selector for selectively providing the timing pulse and the timing data from the timing generator to the wave formatter.

3. A semiconductor test system as defined in claim 1, wherein the test system is operated in a pin multiplex mode where a plurality of test channels are combined in a manner of parallel to serial conversion to generate the test signal waveform of a serial form whose repetition rate is higher than an original repetition rate in proportion to the number of test channel multiplied.

4. A semiconductor test system as defined in claim 1, wherein the test system is a per-pin structure test system in which hardware and software resources are provided for each test channel separately from the other test channels so that test parameters for one channel are produced independently from that of the other channels.

5. A semiconductor test system as defined in claim 1, wherein the timing data is composed of an integral part showing a delay time which is an integer multiple of one cycle of a reference clock and a fractional part showing a delay time which is smaller than the one cycle of the reference clock.

6. A semiconductor test system as defined in claim 1, wherein the wave formatter is formed of:

a set signal path for producing the set signal and having a coarse delay circuit for delaying an incoming signal by an integer multiple of one cycle of a reference clock and a fine delay circuit for delaying an incoming signal by a fractional of the one cycle of the reference clock;

a reset signal path for producing a reset signal and having a coarse delay circuit for delaying an incoming signal by an integer multiple of the one cycle of the reference clock and a fine delay circuit for delaying an incoming signal by a fractional of the one cycle of the reference clock; and a flip-flop circuit for receiving the set signal from the set signal path and the reset signal from the reset signal path to generate the test signal waveform.

7. A semiconductor test system as defined in claim 1, further comprising a driver for receiving an output signal of the wave formatter to provide the test signal waveform to the semiconductor device under test with a predetermined amplitude.

8. A semiconductor test system as defined in claim 1, wherein the virtual timing generator is comprised of:

an edge detector for detecting whether edge data showing two adjacent edges from the waveform memory are identical or not and producing an enable signal when the two edges are different from one another;

a converter for converting the enable signal from the edge detector into an edge data number which indicates pattern edges for truly changing the test signal waveform;

an edge pointer for producing a select signal of the edge data number for the next test cycle;

a first selector for selecting the edge data number from the converter based on the select signal from the edge pointer and providing the selected edge data number to the timing generator; and a second selector for selecting either set command or reset command from the waveform memory and supplying the selected command to the timing generator.

9. A semiconductor test system as defined in claim 8, wherein the edge pointer includes a counter for counting the number of the enable signals from the edge detector and an accumulator for adding the counted data to data in the last test cycle.

\* \* \* \* \*